(12) United States Patent　　(10) Patent No.: US 9,401,690 B2
Guo et al.　　(45) Date of Patent: Jul. 26, 2016

(54) CALIBRATION CIRCUIT AND METHOD

(71) Applicant: Beken Corporation, Shanghai (CN)

(72) Inventors: Dawei Guo, Shanghai (CN); Jianqin Zheng, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 305 days.

(21) Appl. No.: 14/191,440

(22) Filed: Feb. 27, 2014

(65) Prior Publication Data

US 2015/0042391 A1　Feb. 12, 2015

(30) Foreign Application Priority Data

Aug. 6, 2013　(CN) .......................... 2013 1 0341587

(51) Int. Cl.
*H03H 11/16*　　(2006.01)
*H03H 7/48*　　(2006.01)
(52) U.S. Cl.
CPC ........................... *H03H 7/48* (2013.01)

(58) Field of Classification Search
CPC ..................................................... H03H 11/16
See application file for complete search history.

(56) References Cited

U.S. PATENT DOCUMENTS 8,253,467 B2 *　8/2012　Kang .................. H03H 11/20
　　　　　　　　　　　　　　　　　　327/237
2006/0176975 A1　8/2006　Hsieh et al.

* cited by examiner

*Primary Examiner* — Hai L Nguyen
(74) *Attorney, Agent, or Firm* — Perkins Coie LLP (57) ABSTRACT

A circuit comprises a phase combiner and four output ports. The phase combiner adds an in-phase positive input and a quadrature positive input to obtain an in-phase positive output, adds an in-phase negative input and a quadrature negative input to obtain an in-phase negative output, adds the in-phase negative input and the quadrature positive input to obtain a quadrature positive output, and adds the in-phase positive input and the quadrature negative input to obtain a quadrature negative output. The four output ports, are respectively configured to output the in-phase positive output, the in-phase negative output, the quadrature positive output, and the quadrature negative output.

6 Claims, 6 Drawing Sheets

CALIBRATION CIRCUIT AND METHOD

CLAIM OF PRIORITY

This application claims priority to Chinese Application No. 201310341587.8 entitled "CALIBRATION CIRCUIT AND METHOD", filed on Aug. 6, 2013 by Beken Corporation, which is incorporated herein by reference.

TECHNICAL FIELD

The present application relates to circuits, and more particularly but not exclusive to a calibration circuit and method.

BACKGROUND

In-phase and the quadrature (I/Q) signal processing is vastly utilized in conventional communication transceivers. However, the I/Q signal processing has amplitude and phase mismatching between the in-phase and the quadrature branch, which is also called I/Q imbalance or I/Q mismatch. The I/Q imbalance is one of the severe performance bottleneck in transceivers. The amplitude (gain) and phase mismatches between in-phase signal and quadrature signal degrade the signal-to-noise ratio (SNR) in a receiver (RX) side and the error vector magnitude (EVM) in a transmitter (TX) side. The I/Q imbalance mainly stems from the local oscillator (LO). Therefore, it is necessary to reduce I/Q imbalance in a LO generator.

SUMMARY OF THE INVENTION

According to an embodiment of the present invention, a circuit is disclosed. The circuit comprises a phase combiner and four output ports. The phase combiner adds an in-phase positive input and a quadrature positive input to obtain an in-phase positive output, adds an in-phase negative input and a quadrature negative input to obtain an in-phase negative output, adds the in-phase negative input and the quadrature positive input to obtain a quadrature positive output, and adds the in-phase positive input and the quadrature negative input to obtain a quadrature negative output. The four output ports are respectively configured to output the in-phase positive output, the in-phase negative output, the quadrature positive output, and the quadrature negative output.

With the above phase combiner, the phase mismatch between the in-phase and the quadrature can be reduced.

Alternatively, the phase combiner further comprises a first NMOS, a second NMOS, a third NMOS, a fourth NMOS, a fifth NMOS, a sixth NMOS, a seventh NMOS and an eighth NMOS, a first impedance, a second impedance, a third impedance and a fourth impedance. A gate of the first NMOS is configured to receive the in-phase positive input. A gate of the second NMOS receives the in-phase negative input. A gate of the third NMOS is configured to receive the quadrature positive input. A gate of the fourth NMOS is configured to receive the quadrature negative input. Drains of both the first NMOS and third NMOS are connected to the first impedance. The first impedance is connected to Vcc. Drains of both the second NMOS and the fourth NMOS are connected to the second impedance. The second impedance is connected to Vcc. A gate of the fifth NMOS is configured to receive the quadrature positive input. A gate of the sixth NMOS is configured to receive the quadrature negative input. A gate of the seventh NMOS is configured to receive the in-phase positive input. A gate of the eighth NMOS is configured to receive the in-phase positive input. Drains of both the fifth NMOS and seventh NMOS are connected to the third impedance. The third impedance is connected to Vcc. Drains of both the sixth NMOS and the eighth NMOS are connected to the fourth impedance. The fourth impedance is connected to Vcc.

Alternatively, the circuit further comprises a first power detector, a second power detector and a comparator. The first power detector is configured to convert the in-phase positive output and the in-phase negative output to the first direct voltage. The second power detector is configured to convert the quadrature positive output and the quadrature negative output to the second direct voltage. The comparator is configured to compare the first direct voltage and the second direct voltage, and feed comparison result back to the phase combiner.

With the above first power detector, the second power detector the comparator and the phase combiner, the phase and amplitude mismatches between the in-phase and the quadrature can be reduced.

Alternatively, the first power detector is further configured to convert alternating voltage on the drains of both the first NMOS and the third NMOS and alternating voltage on the drains of both the second NMOS and the fourth NMOS, to the first direct voltage. The second power detector is configured to convert alternating voltage on the drains of both the fifth NMOS and the seventh NMOS and alternating voltage on drains of both the sixth NMOS and the eighth NMOS to the second direct voltage.

Alternatively, each of the first power detector and the second power detector further comprises a ninth NMOS, a tenth NMOS, an eleventh NMOS, a twelfth NMOS, a first capacitor, a second capacitor, a third capacitor, a first resistor, a second resistor, a third resistor, and a current source. One terminal of the first capacitor is configured to receive voltage on the drains of both the first NMOS and the third NMOS. The other terminal of the first capacitor is connected to a first bias voltage via the first resistor. The other terminal of the first capacitor is further connected to a gate of the ninth NMOS. A drain of the ninth NMOS is connected to Vdd, a source of the ninth NMOS is connected to a drain of the twelfth NMOS. One terminal of the second capacitor is configured to receive voltage on the drains of both the second NMOS and the fourth NMOS. The other terminal of the second capacitor is connected to the first bias voltage via the second resistor. The other terminal of the second capacitor is further connected to a gate of the tenth NMOS. A drain of the tenth NMOS is connected to Vdd. A source of the tenth NMOS is connected to the drain of the twelfth NMOS. The sources of the ninth NMOS and the tenth NMOS and the drain of the twelfth NMOS are further connected to one terminal of the third resistor. The other terminal of the third resistor is connected to one terminal of the third capacitor. The other terminal of the third capacitor is connected to ground. The source of the twelfth NMOS is connected to ground. Output port of the power detector is connected to the other terminal of the third resistor. A gate of the twelfth NMOS is connected to a gate and a drain of the eleventh NMOS. The drain of the eleventh NMOS is connected to the current source. The source of the eleventh NMOS is connected to ground. The current source is connected to Vdd.

Alternatively, the circuit further comprises a thirteenth NMOS, a fourteenth NMOS, and a fifteenth NMOS. Sources of the first NMOS, the second NMOS, the third NMOS and the fourth NMOS are all connected to a drain of the thirteenth NMOS. A gate of the thirteenth NMOS is connected to the output port of the comparator. A source of the thirteenth NMOS is connected to a drain of the fifteenth NMOS. Sources of the fifth NMOS, the sixth NMOS, the seventh NMOS and the eighth NMOS are all connected to a drain of the fourteenth NMOS. A gate of the fourteenth NMOS receives a second bias voltage. A source of the fourteenth NMOS is also connected to the drain of the fifteenth NMOS. A gate of the fifteenth NMOS is configured to receive a third bias voltage. A source of the fifteenth NMOS is In another aspect of the invention, a method is proposed. The method comprises adding an in-phase positive input and a quadrature positive input to obtain an in-phase positive output; adding an in-phase negative input and a quadrature negative input to obtain an in-phase negative output; adding the in-phase negative input and the quadrature positive input to obtain a quadrature positive output; adding the in-phase positive input and the quadrature negative input to obtain a quadrature negative output; and respectively outputting the in-phase positive output, the in-phase negative output, the quadrature positive output, and the quadrature negative output.

Alternatively, the method further comprises converting the in-phase positive output and the in-phase negative output, to a first direct voltage; converting the quadrature positive output and the quadrature negative output, to a second direct voltage; comparing the first direct voltage and the second direct voltage and generating a comparison result; and adjusting the in-phase positive output, the in-phase negative output, the quadrature positive output and the quadrature negative output according to the comparison result, such that the difference between the first direct voltage and second direct voltage reduces.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those having ordinary skill in the art will understand, however, that the invention may be practiced without many of these details. Additionally, some well-known structures or functions may not be shown or described in detail, so as to avoid unnecessarily obscuring the relevant description.

Figure 1:
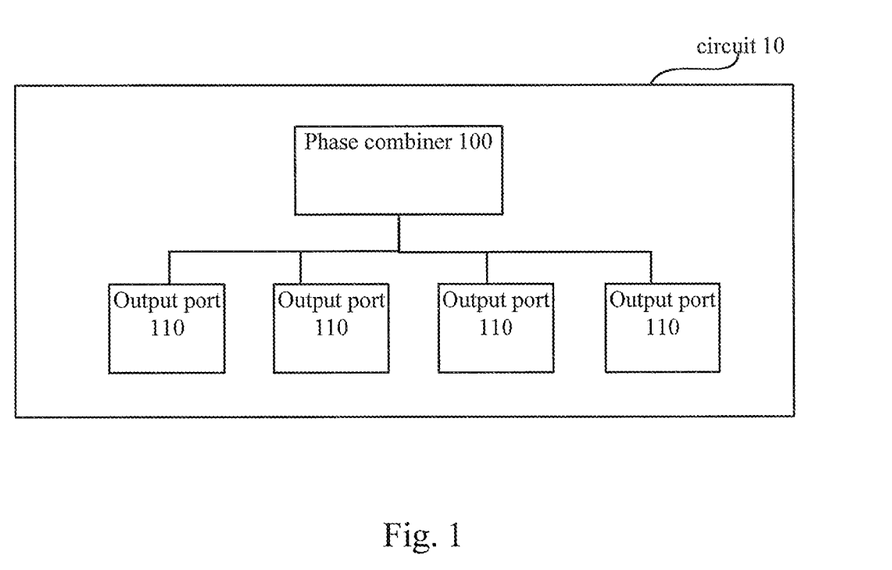
FIG. 1 is a block diagram illustrating a circuit according to an embodiment of the invention.

FIG. 1 is a block diagram illustrating a circuit 10 according to an embodiment of the invention.

As shown in FIG. 1, the circuit 10 comprises a phase combiner 100 and four output ports 110. The phase combiner 100 adds an in-phase positive input and a quadrature positive input to obtain an in-phase positive output, adds an in-phase negative input and a quadrature negative input to obtain an in-phase negative output, adds the in-phase negative input and the quadrature positive input to obtain a quadrature positive output, and adds the in-phase positive input and the quadrature negative input to obtain a quadrature negative output. The four output ports 110, are respectively configured to output the in-phase positive output, the in-phase negative output, the quadrature positive output, and the quadrature negative output. With the above phase combiner, the phase mismatch between the in-phase and the quadrature can be reduced.

Figure 2:
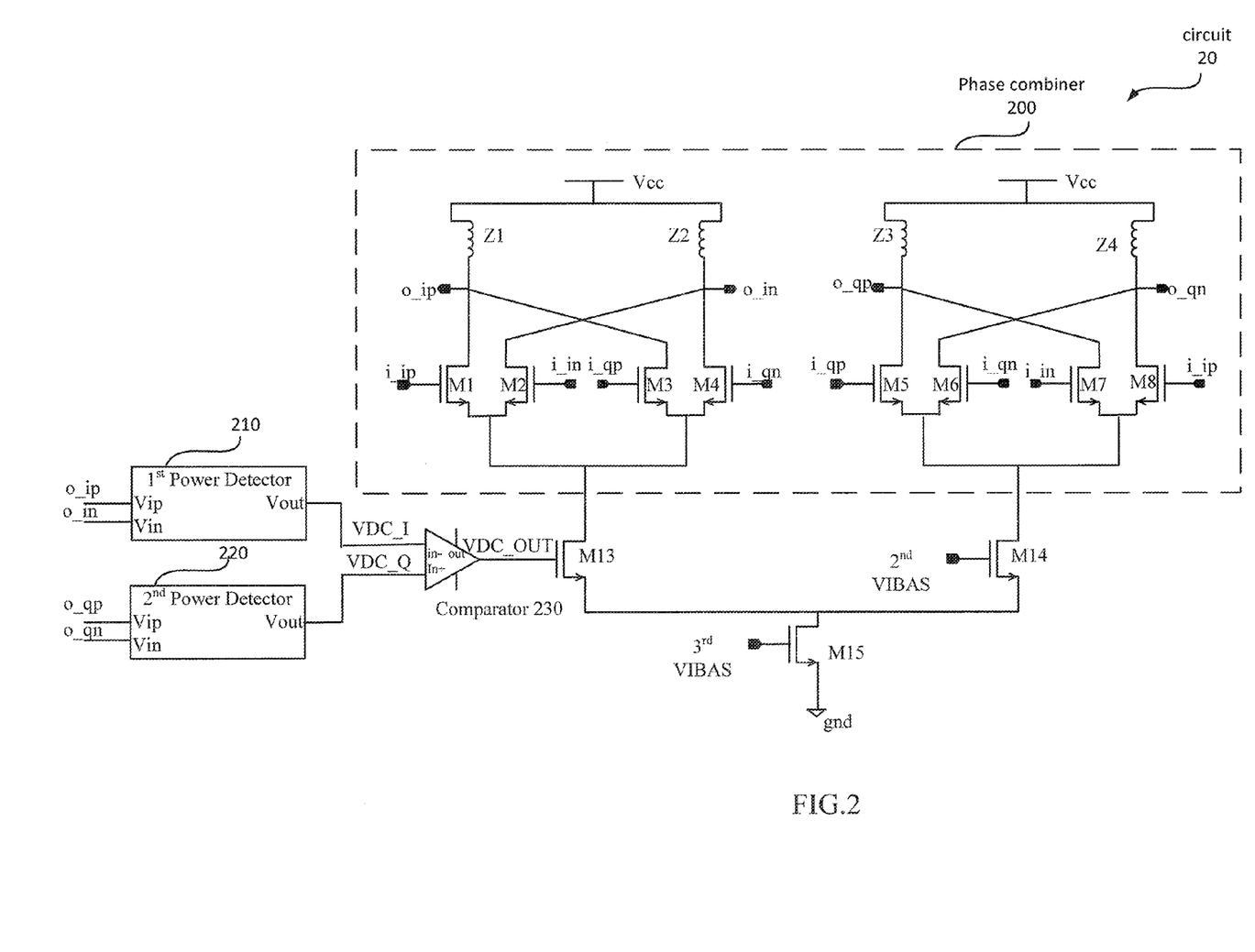
FIG. 2 is a diagram illustrating a circuit 20 according to an embodiment of the invention.

FIG. 2 is a diagram illustrating a circuit 20 according to an embodiment of the invention. The circuit 20 comprises a phase combiner 200. The phase combiner 200 further comprises a first NMOS M1, a second NMOS M2, a third NMOS M3, a fourth NMOS M4, a fifth NMOS M5, a sixth NMOS M6, a seventh NMOS M7 and an eighth NMOS M8. The phase combiner 200 further comprises a first impedance Z1, a second impedance Z2, a third impedance Z3 and a fourth impedance Z4.

As shown in FIG. 2, a gate of the first NMOS M1 is configured to receive the in-phase positive input i_ip. A gate of the second NMOS M2 receives the in-phase negative input i_in. A gate of the third NMOS M3 is configured to receive the quadrature positive input i_qp. A gate of the fourth NMOS M4 is configured to receive the quadrature negative input i_qn. Drains of both the first NMOS M1 and third NMOS M3 are connected to the first impedance Z1. The first impedance Z1 is connected to Vcc. Drains of both the second NMOS M2 and the fourth NMOS M4 are connected to the second impedance Z2. The second impedance Z2 is connected to Vcc. A first output port of the phase combiner 200 is connected to the drains of both the first NMOS M1 and the third NMOS M3 and outputs signal o_ip, which is the in-phase positive input. Therefore, the voltage of the output signal o_ip is proportional to the sum of the voltage of the in-phase positive input i_ip and quadrature positive input i_qp. A second output port of the phase combiner 200 is connected to the drains of both the second NMOS M2 and the fourth NMOS M4 and outputs signal o_in, which is the in-phase negative output. Therefore, the voltage of the output signal o_in is proportional to the sum of the voltage of the in-phase negative input i_in and quadrature negative input i_qn.

A gate of the fifth NMOS M5 is configured to receive the quadrature positive input i_qp. A gate of the sixth NMOS M6 is configured to receive the quadrature negative input i_in. A gate of the seventh NMOS M7 is configured to receive the in-phase negative input i_ip. A gate of the eighth NMOS M8 is configured to receive the in-phase positive input i_p. Drains of both the fifth NMOS M5 and seventh NMOS M7 are connected to the third impedance Z3. The third impedance Z3 is connected to Vcc. Drains of both the sixth NMOS M6 and the eighth NMOS M8 are connected to the fourth impedance Z4. The fourth impedance Z4 is connected to Vcc. A third output port of the phase combiner 200 is connected to the drains of both the fifth NMOS M5 and the seventh NMOS M7 and outputs signal o_qp, which is the quadrature positive input. Therefore, the voltage of the output signal o_qp is proportional to the sum of the voltage of the quadrature positive input i_qp and in-phase negative input i_in. A fourth output port of the phase combiner 200 is connected to the drains of both the sixth NMOS M6 and the eighth NMOS M8 and outputs signal o_qn, which is the quadrature negative output. Therefore, the voltage of the output signal o_qn is proportional to the sum of the voltage of the quadrature negative input i_qn and in-phase positive input i_ip.

Although in FIG. 2, the impedance Z1, Z2, Z3 and Z4 are shown as inductors, Z1, Z2, Z3 and Z4 can also be implemented as resistors.

Alternatively, although not shown in FIG. 2, all of sources of the first NMOS M1, the second NMOS M2, the third NMOS M3 and the fourth NMOS M4 may be connected to a first current source, and all of sources of the fifth NMOS M5, the sixth NMOS M6, the seventh NMOS M7 and the eighth NMOS M8 may be connected to a second current source.

Alternatively, as shown in FIG. 2, the circuit 20 further comprises a first power detector 210, a second power detector 220 and a comparator 230. The first power detector 210 is configured to convert the in-phase positive output o_ip and the in-phase negative output o_in to a first direct voltage VDC_I. The second power detector 220 is configured to convert the quadrature positive output o_qp and the quadrature negative output o_qn to the second direct voltage VDC_Q. The comparator 230 is configured to compare the first direct voltage VDC_I and the second direct voltage VDC_Q, and feed a comparison result back to the phase combiner 200. With the above first power detector 210, the second power detector 220 the comparator 230 and the phase combiner 200, the phase and amplitude mismatches between the in-phase and the quadrature braches of signal can be reduced.

Alternatively, the first power detector 210 is further configured to convert alternating voltage on the drains of both the first NMOS M1 and the third NMOS M3 and alternating voltage on the drains of both the second NMOS M2 and the fourth NMOS M4, to the first direct voltage VDC_I. The second power detector 220 is configured to convert alternating voltage on the drains of both the fifth NMOS M5 and the seventh NMOS M7 and alternating voltage on drains of both the sixth NMOS M6 and the eighth NMOS M8 to the second direct voltage VDC_Q.

Figure 3:
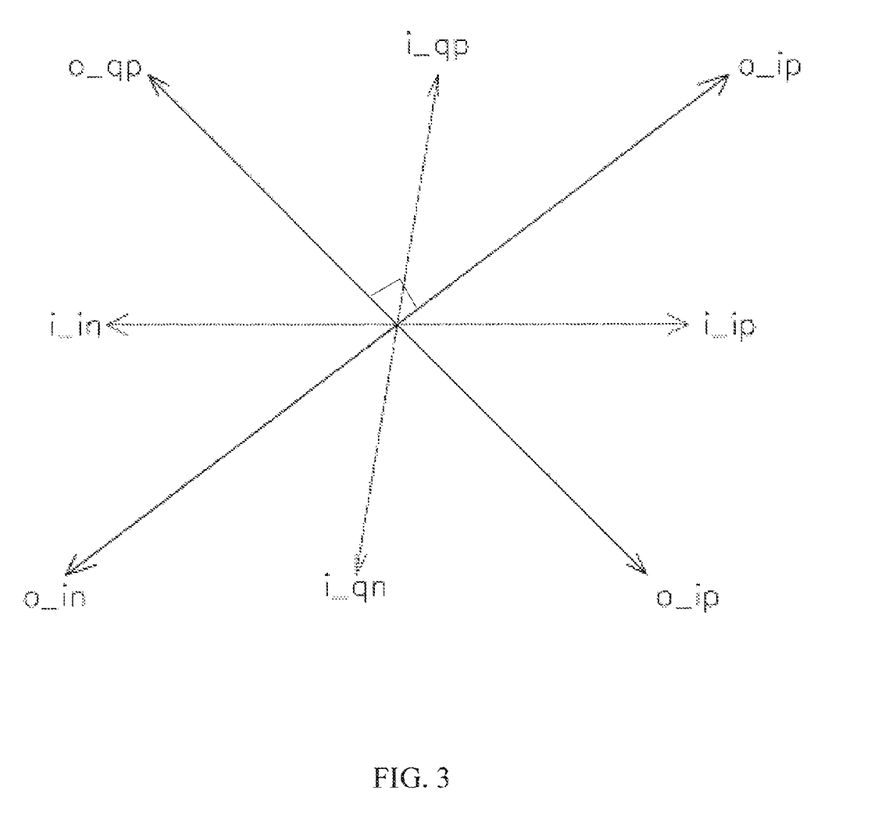
FIG. 3 is a diagram illustrating the output of the phase combiner according to an embodiment of the invention.

FIG. 3 is a diagram illustrating the output of the phase combiner according to an embodiment of the invention. The phase mismatch calibration operates as follow. As shown in FIG. 3, according to the parallelogram principle that diagonals of the parallelogram are perpendicular to each other, the phase of the output of the phase combiner "o_ip" and "o_in" is perpendicular to "o_qp" and "o_qn". Thus, the phase imbalance of the input signals is calibrated.

Figure 4:
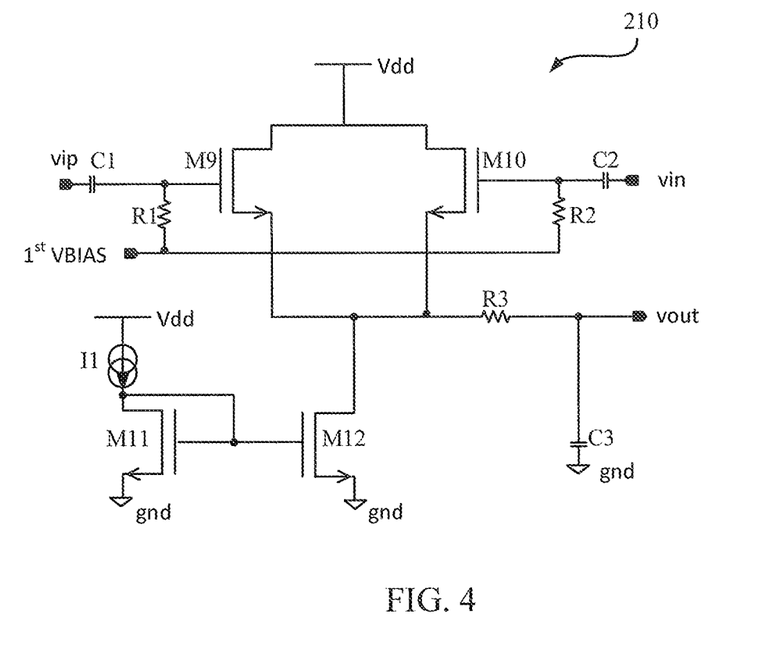
FIG. 4 is a diagram illustrating a power detector according to an embodiment of the invention.

FIG. 4 is a diagram illustrating the first power detector 210 according to an embodiment of the invention. The first power detector 210 and second power detector 220 have similar structures. Hereinafter the first power detector 210 is taken as an example, those having ordinary skill in the art can understand that the second power detector 220 has a substantially same structure as the first power detector 210. As shown in FIG. 4, each of the first power detector 210 and the second power detector 220 further comprises a ninth NMOS M9, a tenth NMOS M10, an eleventh NMOS M11, a twelfth NMOS M12, a first capacitor C1, a second capacitor C2, a third capacitor C3, a first resistor R1, a second resistor R2, a third resistor R3, and a current source I1. One terminal of the first capacitor C1 is configured to receive voltage on the drains of both the first NMOS M1 and the third NMOS M3. That is to say, the terminal of the first capacitor C1 acts as the port Vip of the first power detector 210. The other terminal of the first capacitor C1 is connected to a first bias voltage 1st VBIAS via the first resistor R1. The other terminal of the first capacitor C1 is further connected to a gate of the ninth NMOS M9. A drain of the ninth NMOS M9 is connected to Vdd. A source of the ninth NMOS M9 is connected to a drain of the twelfth NMOS M12. One terminal of the second capacitor C2 is configured to receive voltage on the drains of both the second NMOS M2 and the fourth NMOS M4. The other terminal of the second capacitor C2 is connected to the first bias voltage 1st VBIAS via the second resistor R2. The other terminal of the second capacitor C2 is further connected to a gate of the tenth NMOS M10. A drain of the tenth NMOS M10 is connected to Vdd. A source of the tenth NMOS M10 is connected to the drain of the twelfth NMOS M12. The sources of both the ninth NMOS M9 and the tenth NMOS M10 and the drain of the twelfth NMOS M12 are further connected to one terminal of the third resistor R3. The other terminal of the third resistor R3 is connected to one terminal of the third capacitor C3. The other terminal of the third capacitor C3 is connected to ground (gnd). The source of the twelfth NMOS M12 is connected to ground (gnd). Output port Vout of the first power detector 210 is connected to the other terminal of the third resistor R3. A gate of the twelfth NMOS M12 is connected to a gate and a drain of the eleventh NMOS M11. The drain of the eleventh NMOS M11 is connected to the current source I1. The source of the eleventh NMOS M11 is connected to ground (gnd). The current source I1 is connected to Vdd.

The power detector 210 utilizes full-wave rectification. A full-wave rectifier converts the whole of the input waveform to one of constant polarity (positive or negative) at its output. Full-wave rectification converts both polarities of the input waveform to DC (direct current), and yields a higher mean output voltage. The output of the power detector 210 is proportional to the amplitude of the input signal.

Referring back to FIG. 2, the circuit 20 further comprises a thirteenth NMOS M13, a fourteenth NMOS M14, and a fifteenth NMOS M15. Sources of the first NMOS M1, the second NMOS M2, the third NMOS M3 and the fourth NMOS M4 are all connected to a drain of the thirteenth NMOS M13. A gate of the thirteenth NMOS M13 is connected to the output port of the comparator 230. A source of the thirteenth NMOS M13 is connected to a drain of the fifteenth NMOS M15. Sources of the fifth NMOS M5, the sixth NMOS M6, the seventh NMOS M7 and the eighth NMOS M8 are all connected to a drain of the fourteenth NMOS M14. A gate of the fourteenth NMOS M14 receives a second bias voltage 2nd VBIAS. A source of the fourteenth NMOS M14 is also connected to the drain of the fifteenth NMOS M15. A gate of the fifteenth NMOS M15 is configured to receive a third bias voltage 3rd VBIAS. A source of the fifteenth NMOS M15 is connected to ground (gnd).

The operation principle of the amplitude mismatch calibration is as follow. The amplitudes of the output signals o_ip and o_in are converted to a first direct current (DC) signal VDC_I through the first power detector 210. The first direct current (DC) signal VDC_I is proportional to the output signal o_ip and o_in. The amplitudes of the output signals o_qp and o_qn are converted to a second DC signal VDC_Q through the second power detector 220. The second DC signal VDC_Q is proportional to the output signals o_qp and o_qn. The signals VDC_I and VDC_Q are connected to the comparator 230 in a negative feedback loop.

To be specific, when the amplitudes of output signals o_ip and o_qp are larger than the amplitudes of output signals o_qp and o_qn, VDC_I is larger than VDC_Q. Thus the output of the comparator VDC_OUT will decrease. Then, the current passing through M13 reduces. Therefore, the amplitudes of o_ip and o_in are also reduced.

When the amplitudes of output signal o_ip and o_qp are smaller than the amplitude o_qp and o_qn, VDC_I is smaller than VDC_Q. The output of the comparator VDC_OUT will increase. Then, the current passing through M13 will increase. Therefore, the amplitudes of o_ip and o_in also increase.

Finally, the negative feedback loop will force the amplitudes of o_ip and o_in equal to the amplitudes of o_qp and o_qn. Hence, the amplitude mismatch between the in-phase and quadrature braches of signal is calibrated.

Figure 5:
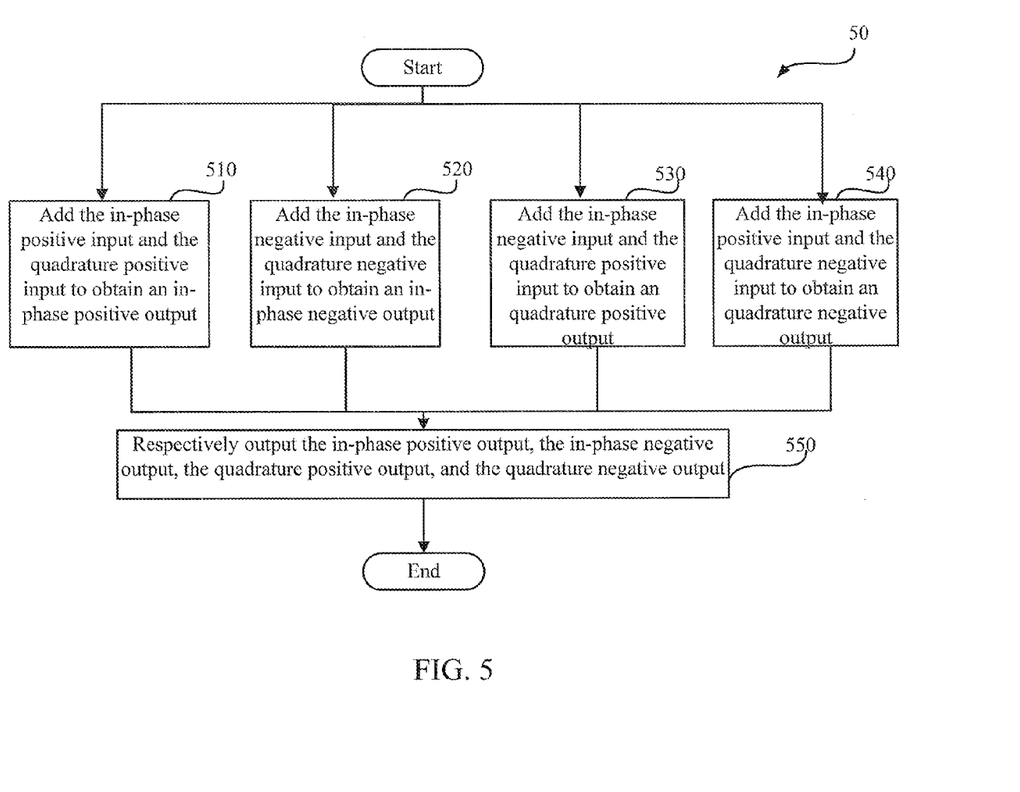
FIG. 5 is a flow chart illustrating a method according to an embodiment of the invention.

FIG. 5 is a flow chart illustrating a method 50 according to an embodiment of the invention. The method 50 comprises adding (in block 510) an in-phase positive input and a quadrature positive input to obtain an in-phase positive output; adding (in block 520) an in-phase negative input and a quadrature negative input to obtain an in-phase negative output; adding (in block 530) the in-phase negative input and the quadrature positive input to obtain a quadrature positive output; adding (in block 540) the in-phase positive input and the quadrature negative input to obtain a quadrature negative output; and respectively outputting (in block 550) the in-phase positive output, the in-phase negative output, the quadrature positive output, and the quadrature negative output.

Figure 5A:
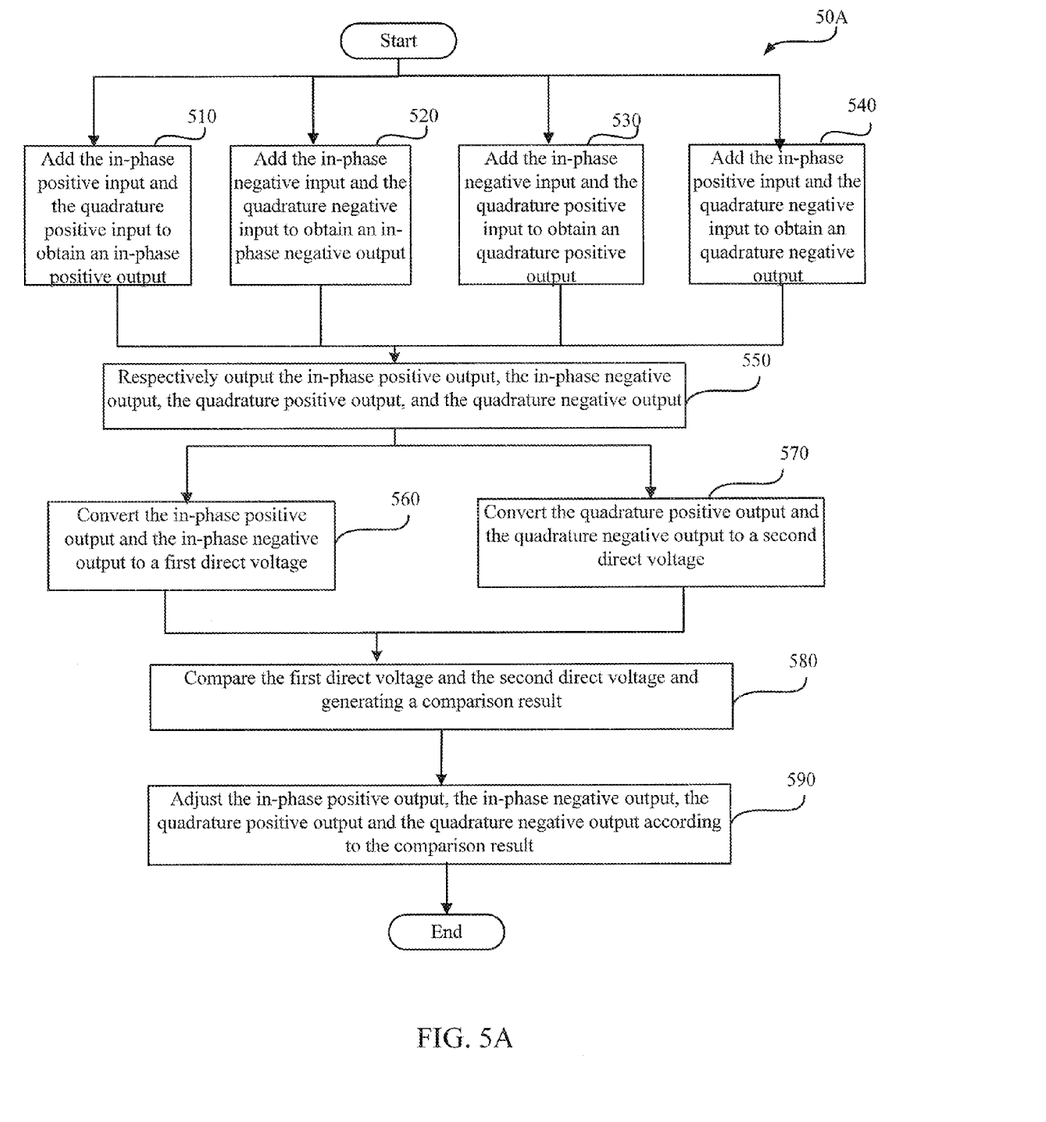
FIG. 5A is a flow chart illustrating a method according to another embodiment of the invention.

FIG. 5A is a flow chart illustrating a method 50A according to another embodiment of the invention. As shown in FIG. 5A, the method 50A further comprises converting (in block 560) the in-phase positive output and the in-phase negative output to a first direct voltage; converting (in block 570) the quadrature positive output and the quadrature negative output to a second direct voltage; comparing (in block 580) the first direct voltage and the second direct voltage and generating a comparison result; and adjusting (in block 590) the in-phase positive output, the in-phase negative output, the quadrature positive output and the quadrature negative output according to the comparison result, such that the difference between the first direct voltage and second direct voltage decreases.

It should be appreciated by those having ordinary skill in the art that components from different embodiments may be combined to yield another technical solution. This written description uses examples to disclose the invention, including the best mode, and also to enable any person having ordinary skill in the art to practice the invention, including making and using any devices or systems and performing any incorporated methods. The patentable scope of the invention is defined by the claims, and may include other examples that occur to those having ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit, comprising:
   a phase combiner, configured to:
      add an in-phase positive input and a quadrature positive input to obtain an in-phase positive output;
      add an in-phase negative input and a quadrature negative input to obtain an in-phase negative output;
      add the in-phase negative input and the quadrature positive input to obtain a quadrature positive output;
      add the in-phase positive input and the quadrature negative input to obtain a quadrature negative output;
   four output ports, respectively configured to output the in-phase positive output, the in-phase negative output, the quadrature positive output, and the quadrature negative output;
   a first power detector, configured to convert the in-phase positive output and the in-phase negative output to a first direct voltage;
   a second power detector, configured to convert the quadrature positive output and the quadrature negative output to a second direct voltage; and
   a comparator, configured to compare the first direct voltage and the second direct voltage, and feed comparison result back to the phase combiner;
   wherein
   the phase combiner further comprises a first NMOS, a second NMOS, a third NMOS, a fourth NMOS, a fifth NMOS, a sixth NMOS, a seventh NMOS and an eighth NMOS, a first impedance, a second impedance, a third impedance and a fourth impedance, wherein a gate of the first NMOS is configured to receive the in-phase positive input, a gate of the second NMOS receives the in-phase negative input, a gate of the third NMOS is configured to receive the quadrature positive input, a gate of the fourth NMOS is configured to receive the quadrature negative input, drains of both the first NMOS and third NMOS are connected to the first impedance, and the first impedance is connected to Vcc, drains of both the second NMOS and the fourth NMOS are connected to the second impedance, and the second impedance is connected to Vcc; and
   a gate of the fifth NMOS is configured to receive the quadrature positive input, a gate of the sixth NMOS is configured to receive the quadrature negative input, a gate of the seventh NMOS is configured to receive the in-phase negative input, a gate of the eighth NMOS is configured to receive the in-phase positive input, drains of both the fifth NMOS and seventh NMOS are connected to the third impedance, and the third impedance is connected to Vcc, drains of both the sixth NMOS and the eighth NMOS are connected to the fourth impedance, and the fourth impedance is connected to Vcc.

2. The circuit of claim 1, wherein
   the first power detector is further configured to convert alternating voltage on the drains of both the first NMOS and the third NMOS and alternating voltage on the drains of both the second NMOS and the fourth NMOS, to the first direct voltage; and
   the second power detector, configured to convert alternating voltage on the drains of both the fifth NMOS and the seventh NMOS and alternating voltage on drains of both the sixth NMOS and the eighth NMOS to the second direct voltage.

3. The circuit of claim 2, wherein each of the first power detector and the second power detector further comprises a ninth NMOS, a tenth NMOS, an eleventh NMOS, a twelfth NMOS, a first capacitor, a second capacitor, a third capacitor, a first resistor, a second resistor, a third resistor, and a current source, wherein
   one terminal of the first capacitor is configured to receive voltage on the drains of both the first NMOS and the third NMOS, the other terminal of the first capacitor is connected to a first bias voltage via the first resistor, the other terminal of the first capacitor is further connected to a gate of the ninth NMOS, a drain of the ninth NMOS is connected to Vdd, a source of the ninth NMOS is connected to a drain of the twelfth NMOS;
   one terminal of the second capacitor is configured to receive voltage on the drains of both the second NMOS and the fourth NMOS, the other terminal of the second capacitor is connected to the first bias voltage via the second resistor, the other terminal of the second capacitor is further connected to a gate of the tenth NMOS, a drain of the tenth NMOS is connected to Vdd, a source of the tenth NMOS is connected to the drain of the twelfth NMOS;
   the sources of the ninth NMOS and the tenth NMOS and the drain of the twelfth NMOS are further connected to one terminal of the third resistor, the other terminal of the third resistor is connected to one terminal of the third capacitor, the other terminal of the third capacitor is connected to ground, the source of the twelfth NMOS is connected to ground, output port of the power detector is connected to the other terminal of the third resistor; and a gate of the twelfth NMOS is connected to a gate and a drain of the eleventh NMOS, the drain of the eleventh NMOS is connected to the current source, and the source of the eleventh NMOS is connected to ground, the current source is connected to Vdd.

4. The circuit of claim 3, further comprising a thirteenth NMOS, a fourteenth NMOS, and a fifteenth NMOS, wherein sources of the first NMOS, the second NMOS, the third NMOS and the fourth NMOS are all connected to a drain of the thirteenth NMOS, a gate of the thirteenth NMOS is connected to the output port of the comparator, a source of the thirteenth NMOS is connected to a drain of the fifteenth NMOS;

sources of the fifth NMOS, the sixth NMOS, the seventh NMOS and the eighth NMOS are all connected to a drain of the fourteenth NMOS, a gate of the fourteenth NMOS receives a second bias voltage, a source of the fourteenth NMOS is also connected to the drain of the fifteenth NMOS; and a gate of the fifteenth NMOS is configured to receive a third bias voltage, and a source of the fifteenth NMOS is connected to ground (GND).

5. The circuit of claim 4, wherein the second bias voltage and the third bias voltage are constant.

6. A method, comprising:

adding an in-phase positive input and a quadrature positive input to obtain an in-phase positive output;

adding an in-phase negative input and a quadrature negative input to obtain an in-phase negative output;

adding the in-phase negative input and the quadrature positive input to obtain a quadrature positive output;

adding the in-phase positive input and the quadrature negative input to obtain a quadrature negative output;

respectively outputting the in-phase positive output, the in-phase negative output, the quadrature positive output, and the quadrature negative output;

converting the in-phase positive output and the in-phase negative output to a first direct voltage;

converting the quadrature positive output and the quadrature negative output to a second direct voltage;

comparing the first direct voltage and the second direct voltage and generating a comparison result; and adjusting the in-phase positive output, the in-phase negative output, the quadrature positive output and the quadrature negative output according to the comparison result, such that the difference between the first direct voltage and second direct voltage reduces.

* * * * *